United States Patent
Burger et al.

(10) Patent No.: US 7,942,111 B2
(45) Date of Patent: May 17, 2011

(54) METHOD AND DEVICE FOR VACUUM-COATING A SUBSTRATE

(75) Inventors: Kurt Burger, Friolzheim (DE); Thomas Weber, Korntal-Muenchingen (DE); Johannes Voigt, Leonberg (DE); Susanne Lucas, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1459 days.

(21) Appl. No.: 11/008,413

(22) Filed: Dec. 9, 2004

(65) Prior Publication Data

US 2005/0098119 A1    May 12, 2005

Related U.S. Application Data

(62) Division of application No. 10/026,259, filed on Dec. 21, 2001, now Pat. No. 6,869,676, which is a division of application No. 09/446,054, filed on Apr. 5, 2000.

(30) Foreign Application Priority Data

Jun. 16, 1997   (DE) ............................... 197 25 383.0

(51) Int. Cl.
  *C23C 14/00* (2006.01)
  *C23C 16/00* (2006.01)
(52) U.S. Cl. ........ 118/723 R; 118/723 MW; 204/192.1; 204/298.01
(58) Field of Classification Search .................... 118/728
See application file for complete search history.

(56) References Cited

U.S. PATENT DOCUMENTS

| | | | |
|---|---|---|---|
| 4,619,865 | A | 10/1986 | Keem et al. |
| 4,727,000 | A | 2/1988 | Ovshinsky et al. |
| 4,783,368 | A | 11/1988 | Yamamoto et al. |
| 4,785,470 | A | 11/1988 | Wood et al. |
| 4,863,549 | A | 9/1989 | Gruenwald |
| 4,963,239 | A | 10/1990 | Shimamura et al. |
| 5,102,687 | A | 4/1992 | Pelletier et al. |
| 5,216,539 | A | 6/1993 | Boher et al. |
| 5,260,107 | A | 11/1993 | Kawamura et al. |
| 5,268,216 | A | 12/1993 | Keem et al. |
| 5,300,205 | A * | 4/1994 | Fritsche ................... 204/192.12 |
| 5,303,139 | A | 4/1994 | Mark |
| 5,500,312 | A | 3/1996 | Harriott et al. |
| 5,547,767 | A | 8/1996 | Paidassi et al. |
| 5,560,638 | A | 10/1996 | Lee |
| 5,569,487 | A | 10/1996 | DeVre et al. |
| 5,593,234 | A | 1/1997 | Liston |
| 5,593,719 | A | 1/1997 | Dearnaley et al. |
| 5,672,054 | A | 9/1997 | Cooper et al. |
| 5,693,376 | A | 12/1997 | Fetherston et al. |

(Continued)

FOREIGN PATENT DOCUMENTS

DE    19500262    9/1995

(Continued)

*Primary Examiner* — Ram N. Kackar
(74) *Attorney, Agent, or Firm* — Kenyon & Kenyon LLP

(57) ABSTRACT

A method is proposed for vacuum-coating a substrate using a plasma-CVD method. In order to control ion bombardment during the vacuum coating, a substrate voltage, produced independently from a coating plasma, is applied to the substrate. The substrate voltage is modified during the coating. The substrate voltage is a direct voltage that is pulsed in bipolar fashion with a frequency of 0.1 kHz to 10 MHz. A wear-resistant and friction-reducing multilayer structure of alternating hard material individual layers and carbon or silicon individual layers is proposed.

3 Claims, 6 Drawing Sheets

U.S. PATENT DOCUMENTS

| | | |
|---|---|---|
| 5,786,068 A | 7/1998 | Dorman et al. |
| 5,928,528 A | 7/1999 | Kubota et al. |

FOREIGN PATENT DOCUMENTS

| | | |
|---|---|---|
| DE | 69017744 T | 9/1995 |
| DE | 195 13 614 | 10/1996 |
| DE | 196 09 804 | 7/1997 |
| EP | 0 395 415 | 10/1990 |
| EP | 0 678 903 | 10/1995 |
| EP | 0 701 982 | 3/1996 |
| EP | 0 827 817 | 3/1998 |
| JP | 60091629 | 5/1985 |
| JP | 63093861 A * | 4/1988 |
| JP | 2205666 | 8/1990 |
| JP | 3114234 | 5/1991 |
| JP | 4041672 | 2/1992 |
| JP | 4030900 | 4/1992 |
| JP | 4285170 | 10/1992 |
| WO | WO95/26879 | 10/1995 |

* cited by examiner

METHOD AND DEVICE FOR VACUUM-COATING A SUBSTRATE

CROSS-REFERENCE TO RELATE APPLICATIONS

This application is a division of prior application Ser. No. 10/026,259, filed Dec. 21, 2001, now U.S. Pat. No. 6,869,676 which is a division of application Ser. No. 09/446,054 filed Apr. 5, 2000, which is the national phase of International Application Serial No. PCT/DE98/01610.

FIELD OF THE INVENTION

The present invention relates to a method and device for vacuum-coating a substrate.

BACKGROUND INFORMATION

A method of this type is described in German Patent No. 19513 614. According to this patent, the coating of a substrate with amorphous layers of carbon takes place through the application to the substrate of a bipolar voltage whose positive and negative pulse durations can be adjusted separately from one another. During the depositing, the positive pulse duration is smaller than the negative pulse duration, and the pulse frequency is in the range from 5 to 100 kHz. In order to improve the adhesion of the produced amorphous carbon layer to the substrate, a modified carbon intermediate layer is applied that contains metal. In this conventional method, plasma production and ion bombardment of the growing layer are realized together using the applied bipolar voltage, and cannot be controlled individually. For many qualities of layer, the layer deposition using this process is therefore limited to a comparatively narrow process window.

From the German Patent No. 196 09 804, a method is described for the plasma coating of bulk material in which a rotating basket moves slowly about a plasma coating source. A voltage can be applied to the rotating basket in order to bring the bulk material to be coated to an electrically negative potential. Means for producing a cleaning plasma, with which the bulk material is cleaned before the beginning of the layer deposition, are located inside the rotating basket. In this context, the cleaning plasma is produced independently of the voltage applied to the rotating basket and to the bulk material. A negative electrical charging of the bulk material to be coated is in general also provided for the subsequent coating step. No further indications are disclosed concerning the manner in which the negative charging is to take place.

A method for the manufacture of hard amorphous carbon layers is described in R. S. Bonetti, M. Tobler, Aindustriell hergestellte diamantartige Schichten,@ Oberfläche und JOT, vol. 9, 1988, p. 15. In a plasma-supported CVD method, plasma production and negative substrate bias voltage are realized together, using a radio-frequency (RF) power supply applied to the substrate. The substrate potential ensures the ion bombardment required for the depositing of layers that are dense and hard and therefore resistant to wear. For this purpose, the ratio between the surface of the parts to be coated and the inner wall surface of the recipient must be smaller than 1, which limits, in an undesirable manner, the charge density and ability to scale the method upward for industrial charge quantities. Another disadvantage is the required load-dependent matching of the RF coupling.

SUMMARY OF THE INVENTION

An object of the present invention is to indicate a method and device that can be scaled upward and used for industrial charge quantities, which permits the coating of substrates uniformly and at a high rate, and produces a multilayer structure that is wear-resistant and that reduces friction.

The object is achieved due to the separation of the production of the substrate voltage from the production of the plasma. The present invention allows a well-directed influencing of the physical properties of the produced layers. Among others, the layer hardness, the ability to withstand abrasion, the elasticity of the layer and the internal stress of the layer can be influenced. Substrates having complex geometries can also be coated. In this context, the separation of plasma production and substrate voltage production allows a controlling of the substrate temperature. In this way, the layer deposition can take place in multiple fashion at temperatures of 200EC and lower. As a substrate voltage, a pulsed bipolar direct voltage is advantageously used that can be changed with regard to the size and duration of the negative impulse, the size and duration of the positive impulse, and the voltage-free intermediate intervals, that is, pause periods. In order to expand the possible achievable layers, the addition of various process gases in suitable mixture and sequence is usefully provided.

The separation of plasma production and substrate voltage production does not limit a device suitable for the execution of the method to the use of a particular plasma production source. Rather, all plasma-producing sources, such as microwave sources, high-frequency sources, hollow cathodes or high-current arcs, are possibilities. As a power supply for the production of the substrate voltage, a direct-voltage power supply pulsed in bipolar fashion is useful, making it possible to support a direct voltage and realize voltage-free pause periods. Screens that shield a part of the coating chamber are advantageously provided in the coating chamber. The properties of the produced layers can be influenced easily by moving the parts to be coated through the resulting partial volumes, which have different plasma densities, that arise in this context.

A multilayer structure manufactured according to the present invention has the considerable advantages that it is made up of alternating layers of hard material and hard carbon layers, the latter additionally containing, if necessary, oxygen and/or silicon and/or metal. In the structure, the resistance to wear of the hard material, and in particular the outstanding resistance to wear and friction-reducing lubricating effect of the inventively manufactured hard carbon, work together synergistically with the multilayer structural properties. The multilayer structure has, for example, a greater hardness than the individual layers of which it is made. Moreover, the multilayer structure is more ductile and more elastic than an individual layer of comparable hardness.

Due to the synergistic cooperation of the above-cited properties, the multilayer structures manufactured according to the present invention can advantageously be used in new areas of application. Thus, they are generally suited for use as protection against corrosion and wear for components that are tribologically highly loaded, and are suited, in particular, for use as wear protection of components in situations of dry operation and lack of lubrication. For example, the multilayer structures are suitable for use as a lubricating anti-wear and anti-corrosion layer for machining tools and non-cutting shaping tools, whose lifespan are increased considerably in this way, they enable dry processing or processing with minimal lubrication using tools coated therewith, so that cooling lubricants can be done without entirely, lubricating the dry process or at least the quantity of lubrication required can be greatly reduced. In addition, the coating with multilayer structures manufactured according to the present invention enables improvement of the protection against corrosion of components in aggressive media, and, if coated tools are used, the processing speed and processing quality of components can be raised.

It is advantageous if the carbon layer is made of amorphous carbon containing hydrogen (hereinafter a-C:H), amorphous hydrogen-free carbon (a-C), carbon (containing hydrogen or hydrogen-free) containing silicon, or carbon (containing hydrogen or hydrogen-free) containing metal (C—(MeC)). The metal is selected from the hard secondary group metals. This selection enables the user to react flexibly to demands that are made with regard to the lubricating action and the hardness of the carbon layer, and (see above) to possible difficulties of adaptation to the hard material layer.

Alternatively, instead of the carbon containing silicon layers, additional layers containing, if necessary, hydrogen and/or carbon and/or metal, can be built into the multilayer coating. It is true that these have no lubricating effect, but they are also characterized by a high degree of hardness (even if as a rule they are somewhat softer than carbon layers) and lower friction coefficients. A particular advantage is the low degree of dependence of the layer properties, in particular the friction coefficient, on the ambient humidity.

It is advantageous if the silicon layer is made of amorphous silicon containing hydrogen (hereinafter a-Si:H), amorphous hydrogen-free silicon (a-Si), silicon (containing hydrogen or hydrogen-free) containing carbon, or silicon (containing hydrogen or hydrogen-free) containing metal (Si-(MeSi)). As with carbon, this selection makes it possible in particular to react flexibly to demands.

A multilayer structure of hard layers, lubricating layers and, if necessary, oxidation-resistant layers, the properties of the structure are determined by the combination of the properties of the individual layers, is described in U.S. Pat. No. 4,619,865, but hard carbon or silicon layers, or hard carbon or silicon layers containing the metals named, are not described in the patent, in particular not as friction-reducing layers.

With respect to their composition, the individual layers are preferably made of one type, or several types, of the hard material layer, and one type, or several types, of the carbon layer or the silicon layer. The individual layers are made up most preferably of one type of the hard material layer and of one type of the carbon layer or of the silicon layer.

In order to exploit optimally the advantages of the multilayers, it is advantageous if the thicknesses of the individual layers are between approximately 1 nm and approximately 10 nm, and preferably between approximately 2 nm and approximately 5 nm, and if the overall thickness of the structure is between approximately 1 Fm and approximately 10 µm, and preferably between approximately 1 Fm and 4 µm.

It is advantageous if the hard material layer is made up of a metal (hereinafter Me), a metal compound, carbon containing metal carbide (C—(MeC)), silicon containing metal silicide (Si—(MeSi))—the latter two materials having, among other things, the desired hardness due, for example, to a corresponding selection of the metal—or mixtures of at least two of the named materials. This selection makes it possible for the user to react flexibly to demands relating to the hardness of the hard material layer, and possible difficulties of adaptation to the carbon layer or the silicon layer, and—if advantageous—also additionally to equip the layer with a certain friction-reducing effect.

Advantageous combinations of the hard material layer and the carbon layer result if the hard material layer is made of Me, a metal carbide (MeC), a metal nitride (MeN), a metal silicide (MeSi), a metal carbonitride (Me(CN)), a metal carbosilicide (Me(CSi)), or a metal siliconitride (Me(SiN)), and the carbon layer is made of a-C:H or a-C; if the hard material layer is made of C—(WC) and the carbon layer is made of a-C:H, the hard material layer having a high degree of hardness due to the use of tungsten, but also having a considerable lubricating effect due to the carbon portion, which is not bound chemically to metal; and if the hard material layer is made of MeC and the carbon layer is made of C—(MeC), the hardness being particularly pronounced here, though at the cost of the lubricating effect.

Advantageous combinations of the hard material layer and the silicon layer result if the hard material layer is made of Me, MeC, MeN, MeSi, Me(CN), Me(CSi), or Me(SiN), and the silicon layer is made of a-Si:H or a-Si.

DETAILED DESCRIPTION

Figure 1:
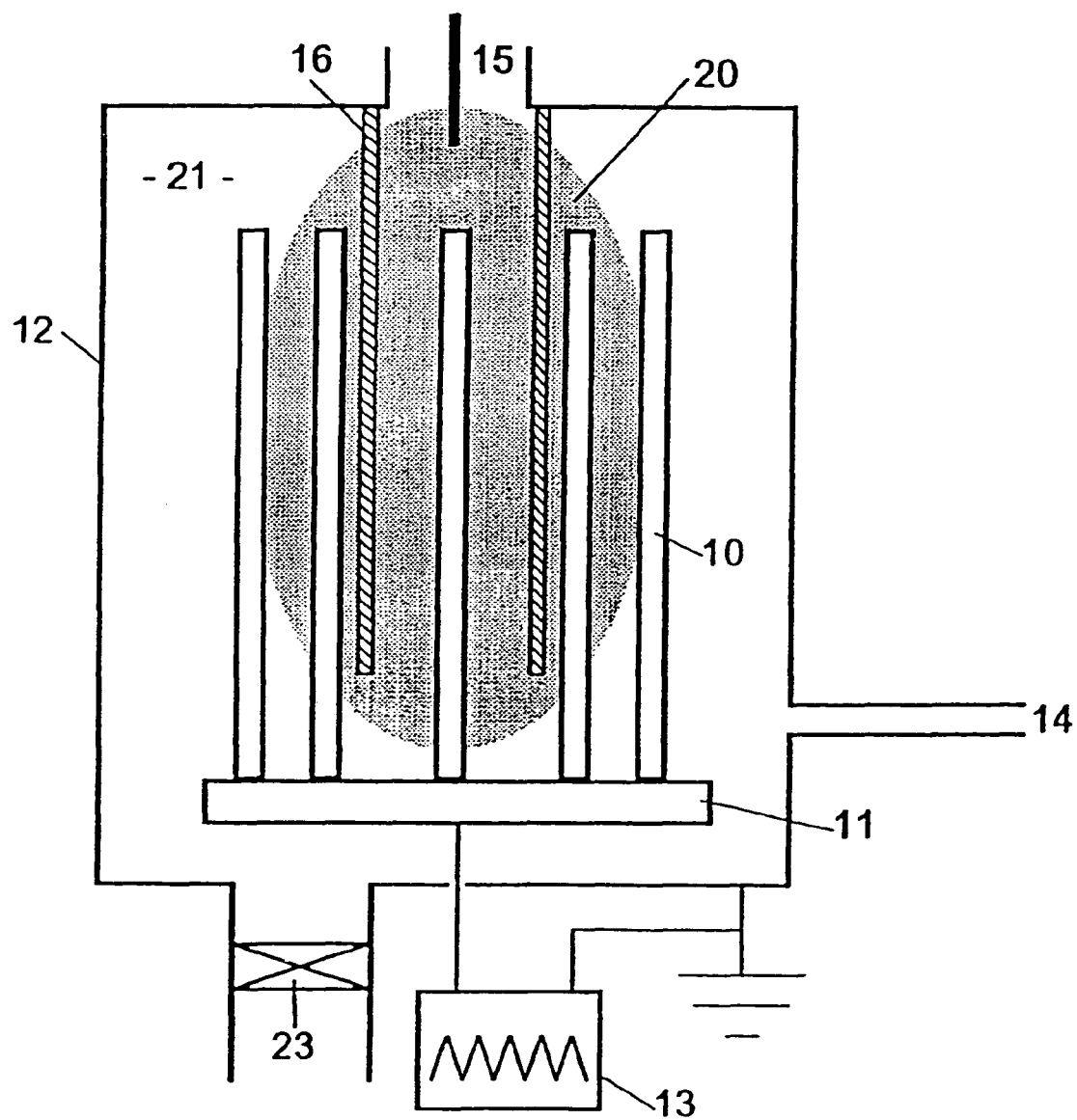
FIG. 1 shows a side view of a first embodiment of a device for plasma-CVD coating of substrates according to the present invention.

FIG. 1 shows a device for carrying out the proposed method. It includes a vacuum recipient 12, in which a bearing device 11 is arranged on which substrates 10 that are to be coated are located. Substrates 10 are coupled electrically to a voltage supply 13 that is arranged outside recipient 12. Bearing device 11 is constructed such that substrates 10 can be rotated uniformly during the coating, e.g., as indicated in FIG. 1, in the form of a rotating disk. The substrates may be rotated additionally about further axes of rotation, using corresponding devices. A bipolar equal pulse source, capable of an additional superposition of a direct voltage potential, is used as a voltage supply 13. This source permits the application of pulsed unipolar or bipolar direct voltage potentials of up to several kV, having frequencies of 0.1 kHz to 10 MHz, the length and height of the positive and negative pulses being adjustable separately from one another, and voltage-free pause times being realizable. Vacuum recipient 12 has a gas inlet system 14 via which gases can be brought into its interior. In addition, recipient 12 has a pump system 23 for its evacuation. Additionally, at recipient 12 there is a microwave source 15 for the coupling of microwaves into recipient interior 21, where they produce a plasma 20. This source is fashioned, for example, as a quartz window having a waveguide radiator or having antenna configurations. In recipient interior 21 there are magnets 16, which, as indicated in FIG. 1, can be constructed as magnet banks. They produce a uniform distribution of plasma 20 using microwave source 15 in recipient interior 21, and are arranged correspondingly.

Figure 2:
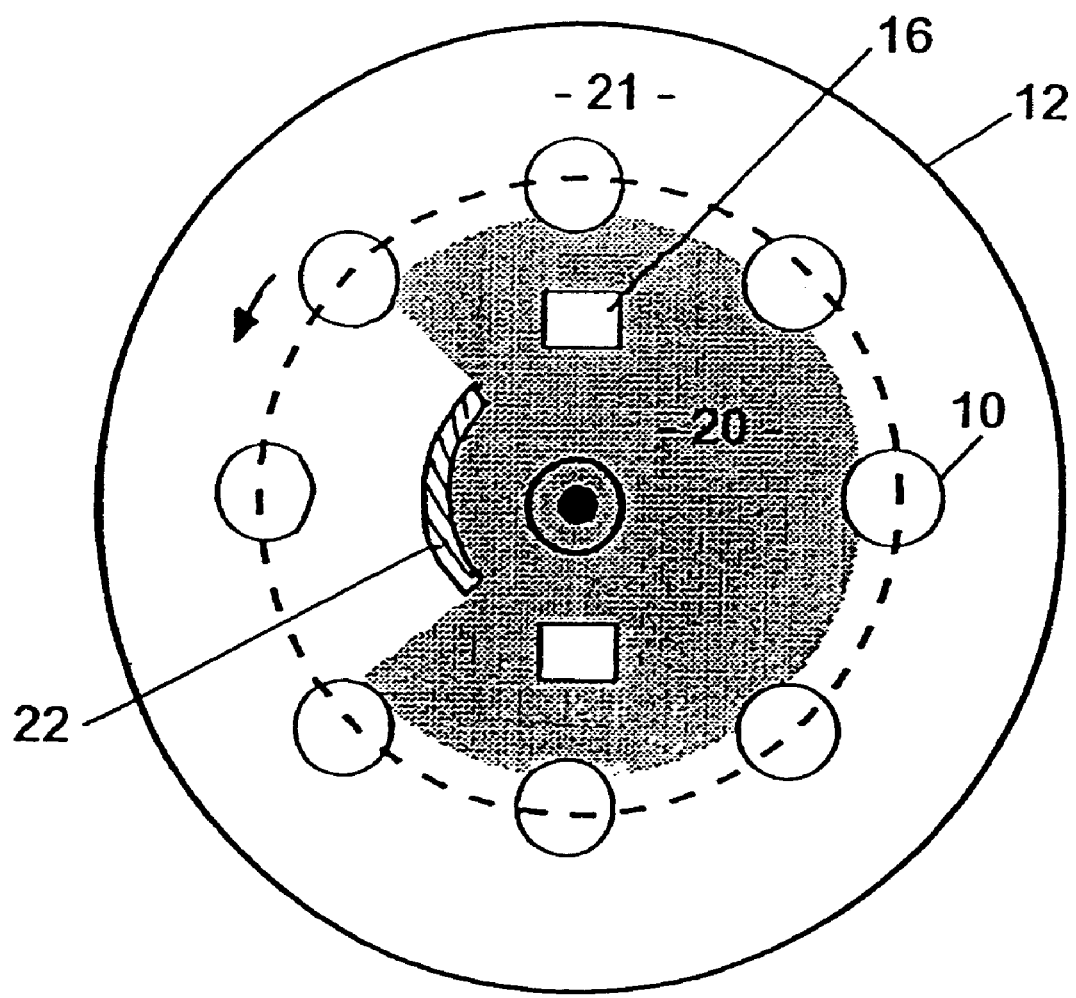
FIG. 2 shows a top view of the device shown in FIG. 1.

The arrangement of plasma source 15 takes place in accordance with constructive and process-technical boundary conditions. For this purpose, it can take place, as shown in FIG. 1, centrically in relation to bearing device 11 on a wall surface, or in distributed fashion over recipients 12. In the case of a centric arrangement, a plasma 20 results that is essentially centrally symmetrical, providing for a uniform coating of the inward-pointing substrate surfaces, while the coating rate of the outward-pointing surfaces is lower, and resulting in a deposition of layers of a different quality. Given a plasma source arranged on a side wall of recipient 12, the converse situation results. Plasma sources can also be combined internally and externally, in order to produce layers that have yet another quality and other properties. In addition, screens 22 can be provided in recipient 12; these screens prevent the formation of a plasma in a part of recipient interior 21. In this way, different coating conditions can be produced in recipient interior 21, for the production of different individual layers. For this purpose, substrates 10 that are to be coated are moved, as shown in FIG. 2 with arrows, through the partial volumes of recipient interior 21 having the different plasma conditions. As a consequence, controllable properties of the growing overall layer result. The overall layer is made up of individual or numerous individual layers as a multiple layer coating or multilayer coating.

The operation of the arrangement shown in FIGS. 1 and 2 takes place by or in recipient interior 21, after evacuation using pump system 23 to a residual pressure of, typically, $10^{-4}$ mbar. Substrates 21 to be coated are then usefully first preconditioned, e.g. by heating, cleaning by means of plasma etching, and pre-coating in order to improve the adhesion of the subsequently applied layer. Subsequently, a gas is introduced into recipient 21 via gas inlet system 14, and a plasma 20 is produced using microwave source 15. Particular plasma conditions arise in this context if the gases are introduced into the recipient through the plasma source or near the plasma source; for example, a spatially increased plasma density and/or an increased gas conversion. A range of gases and gas mixtures are suitable as gases. Reactive gases for the application of carbon-containing layers are for example hydrocarbons $C_xH_y$, in particular $C_2H_2$ and $CH_4$. For the application of silicon-containing layers, silanes and siloxanes are suitable, in particular $SiH_4$ and HMDS, HMDS(O), HMDS(N), TEOS, TMS. For the production and maintenance of plasma 20, noble gases such as argon, neon, or helium are used. Given the use of argon, by variation of the argon partial pressure it is possible to adjust the bombardment with non-layer-forming ions during the layer deposition, and in this way to adjust the hardness and internal stress of the layer. If helium is used, it is possible to influence the hydrogen portion brought into the layers by gases containing hydrogen, and additionally seal the layers. If neon is used, a well-directed compacting of the layers can be achieved. If metallo-organic compounds are used as a reactive gas, the bringing of metals into the coating can take place via the reactive gas. The H content of the layers can be influenced using $H_2$; using $N_2$, $NH_2$ or gases containing boron, it is possible to influence the layer properties with regard to internal stresses and wetting behavior. Gases containing Si influence the internal stresses and the wetting behavior of carbon layers; in silicon layers, gases containing C lead to lower friction, doping, electrical conductivity and the deposition of a-SiC:H.

Independent of the production of plasma 20, with the aid of voltage supply 13 a changeable voltage potential, the substrate voltage US, is applied during the coating to substrate 10. This voltage is used to control the ion bombardment of substrate 10 during the coating. Given electrically insulating substrate surfaces, the positive portion of the substrate voltage effects a discharging of the surface charged by the preceding ion bombardment. For this purpose, the duration of the positive pulses is to be held less than or equal to the duration of the negative pulses. If the temperature loading of the substrate is to be kept low, the voltage amplitude of the positive pulses is selected to be significantly lower than that of the negative pulses.

By varying the composition of the supplied gas and the quality of substrate voltage US produced by voltage supply 13, layer systems that have a multiplicity of layers, each with different layer properties, can be built up on substrates 10. In particular, hard, wear-resistant layers that are resistant to corrosion and have a low friction coefficient can be produced. The adhesion of layers, in particular of hard layers or layers that have high mechanical internal stresses, can often be further improved by the use of suitable intermediate layers. It has proven particularly advantageous to form gradient layers that enable a smooth transition with regard to their mechanical characteristics, in particular hardness and elasticity, to the functional layer. In this way, the adhesion of an amorphous carbon layer to a steel substrate is improved by the use of an intermediate layer system that is made up of metallic carbon layers and modified carbon layers containing metal that, through suitable process control, pass over into one another in graded fashion. Such carbon layers containing metal can be applied easily by reactive sputtering of metal. Here argon (Ar) is supplied as an additional gas for the maintenance of the sputtering process.

Alternatively, adhesive layer systems can be used that are based on amorphous silicon layers or silicon carbon layers. Besides the corresponding gases containing carbon, silanes and siloxanes are suitable as reactive gases for the deposition of such layers.

Using the arrangement shown in FIGS. 1 and 2, in a first application a 2 μm-thick amorphous carbon layer (a-C:H or DLC) can be deposited on steel (100Cr6) and silicon, with an intermediate layer that imparts adhesion. In this context, the following process parameters were set: reactive gas: acetylene with a flow-through of 300 standard $cm^3$/min, recipient pressure: $3\times10^{-3}$ mbar, microwave power: 1 kW, electrical power: 1 kW, substrate voltage: pulsed in bipolar fashion, positive pulses: 10 μsec, negative pulses: 10 μsec. The produced layer had a microhardness of 35 GPa with a modulus of elasticity of 165 GPa. Given spatial conditions, the coefficient of friction against steel (100Cr6) was 0.12 in dry operation. Such a layer is particularly suitable for use as a wear protection layer. By varying the electrical power between 200 W and 2 kW, it was possible to vary the layer hardness in the range from 10 GPa to 42 GPa. Given shortening of the negative pulse, harder layers and a higher deposition rate resulted with, however an increasing substrate temperature. By setting voltage-free pause times after each pulse, with a reduction of the coating rate and layer hardness it is possible to lower the coating temperature. It can be advantageous to select the pause time after a negative pulse to be smaller than the pause time after a positive pulse. It was possible to further improve the layer adhesion by pre-cleaning substrate 10 outside the arrangement, according to a conventional method. It was possible to control the layer deposition rate by variation of the microwave power between 0.6 kW and 1.1 kW, as well as variation of the acetylene gas flow between 100 and 450 standard $cm^3$/min. In addition, it proved advantageous to carry out a plasma fine cleaning, according to a conventional method, after bringing substrate 10 into recipient 12 and evacuation. The layer adhesion can be further improved by bringing in a reactive gas containing silicon at the beginning of the coating process, for the purpose of depositing a layer that imparts adhesion.

The properties of amorphous carbon layers can be adjusted for example via the hydrogen content or doping; with regard to its optical and electrical characteristics this adjustment can take place over a broad spectrum of absorption and black color up to transparency, or conductivity up to an insulating effect. In this way, the layers are suited for applications with optical and electrical demands, for example as an electrically insulating layer, a transparent anti-scratch layer, a decorative wear-resistant layer, or as a black-matrix layer in a display.

In a further application of the arrangement shown in FIGS. 1 and 2, it was possible to apply a metal-free amorphous carbon layer 2.5 μm thick to a steel (100Cr6) substrate as protection against corrosion. Before bringing the substrate into the recipient, the apparatus was cleaned in order to remove loose particles and to avoid the chipping off of layers existing from previous coating cycles, and thus to ensure a non-porous layer construction. The process parameters were selected as in the previous example, but a lower operating pressure of $1-2\times10^{-3}$ mbar was set in order to reduce the effect of the particle formation.

In a further application, the arrangement shown in FIGS. 1 and 2 is suited for the production of multilayer coatings built up from a multiplicity of thin individual layers of differing hardness and voltage states. Such multilayer coatings are distinguished by particularly low internal stresses with a high degree of hardness. Among other applications, this technique can be applied with amorphous carbon and silicon layers. The multilayer construction of individual layers is realized through periodic variation of the substrate voltage. When the substrate voltage is reduced, softer layers are produced; when it is increased, harder layers are produced. The layer structure can be varied from graphitic layers, corresponding to a substrate voltage of 0 volts, up to layers that have hardnesses of more than 50 GPa. In this context, the duration of the individual pulses of the substrate voltage is adapted to the layer growth rate in such a way that individual layers between 1 nm and 2 μm, and preferably 5 nm to 200 nm, are deposited. The transition between the individual layers is effected by the abrupt modification of the substrate voltage. Alternatively, the variation of the substrate voltage can take place slowly, so that a continuous transition arises between the individual layers. A process controlling parameter can be provided such that the multilayer bond that arises is made up of a multiplicity of different types of individual layers.

For the support of the different construction of the individual layers, in addition to the substrate voltage a variation of the microwave power coupled in via microwave source 15, or of the quantity of supplied gas, can be provided. Both effect a variation of the plasma density, as well as the operating pressure, and thus the ion energy distribution, which is to be set in well-directed fashion for the respectively desired layer properties.

A variation of the process parameters for the production of a multilayer bond made up of many individual layers can also be effected by articulation of recipient interior 21 into partial volumes that have different plasma densities, by moving substrates 10 to be coated through the different partial volumes one after the other in periodic fashion. Such an articulation of the recipient interior can, for example, be achieved, as shown in FIG. 2, by screens 22, which prevent the formation of plasma 20 in a part of recipient interior 21. Given rotational motion of the substrate, for example by rotation of a bearing device 11 fashioned as a rotating disk, the thickness of the individual layers can be controlled via the frequency of rotation of the substrates through the partial volumes.

Alternatively, an articulation of recipient interior 21 into partial volumes can also be achieved by the simultaneous use of different plasma sources placed at various points of recipient 12, such as microwave source(s) and hollow cathode(s), or different microwave sources.

Figure 3:
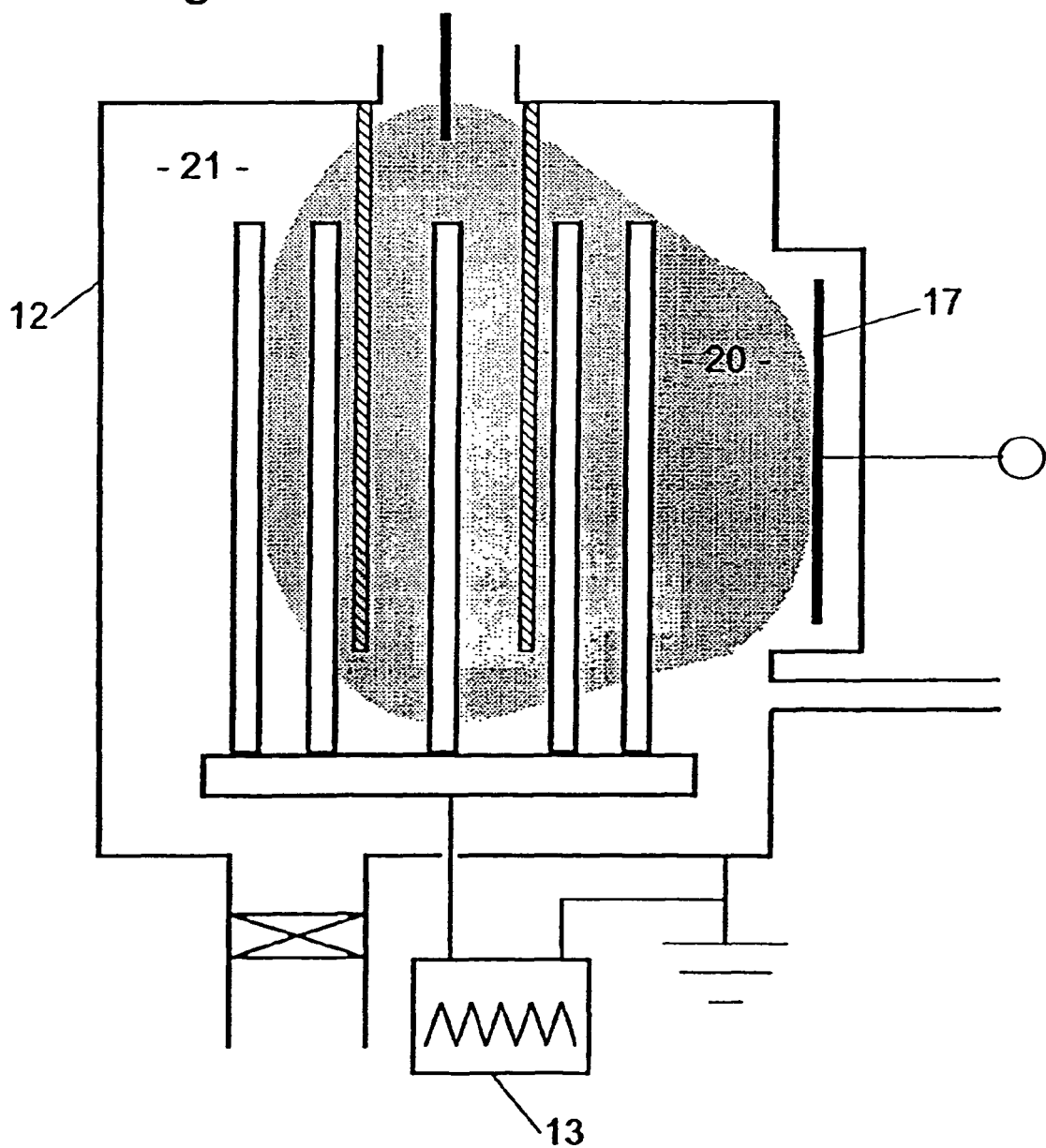
FIG. 3 shows a second embodiment of a device for plasma-CVD coating of substrates according to the present invention.

In another variant construction, a modified carbon layer containing metal is selected as the softer of two individual layers. The application of the partial layers takes place in a conventional manner, through reactive magneton sputtering. A modified arrangement suitable for this purpose is shown in FIG. 3. It differs from an arrangement according to FIGS. 1 and 2 by an additional magnetron sputtering source 17, which, as indicated in FIG. 3, can be arranged laterally in the recipient wall. By controlling the back-sputtering from the substrates 10 via the applied substrate voltage, the arrangement permits well-directed influencing of the metal portion built into the layers that arise.

A further application provides the use of the same process parameters as in the first example of application, but silane or siloxane is added as an additional reactive gas, at 20 standard-cm$^3$/min. The silane or gas containing Si, as additional reactive gas, leads to a build-up of several atomic percent of silicon in the deposited layer. It effects a reduction of the layer internal stresses, and influences the wetting behavior with respect to different liquids. In this way, in particular the behavior of a coated substrate in tribological contact can be controlled. In a variant of this application, the gas flow of the gases containing Si can be selected so that it is greater than that of the acetylene. In this way, a silicon layer containing hydrogen can be deposited that has carbon as an additional component. In order to increase the adhesion to glass and to metallic substrates such as steel (100Cr6), the application of a modified silicon adhesive layer has proven effective.

In a further variant, the portion of the acetylene in the reactive gas is chosen at zero, so that an amorphous silicon layer containing hydrogen (a-Si:H) is deposited. Such a layer is suited as a wear protection layer. It can be further modified. Thus, through the addition of a corresponding component, a stoichiometric compound can be deposited. An example of this is the deposition of siliconitride (SiN) containing hydrogen, through the addition of nitrogen to the reactive gas. The resulting layer is distinguished by high resistance to wear and an electrical insulating effect. Additional layers can be produced analogously for other applications, for example layers for the construction of electrical semiconductor elements. The required electrical properties can be set via the process parameters, for example via the hydrogen content and a doping. An insulating effect is achieved by the deposition of an insulating compound. Such layers are for example suitable for the manufacture of solar cells or flat panel displays, in which the possibility of deposition over a large surface offers a particularly great advantage.

The transparent, scratch-proof or also electrically conductive coating of glass, solar cells and displays is another area of application of these layers.

Figure 4:
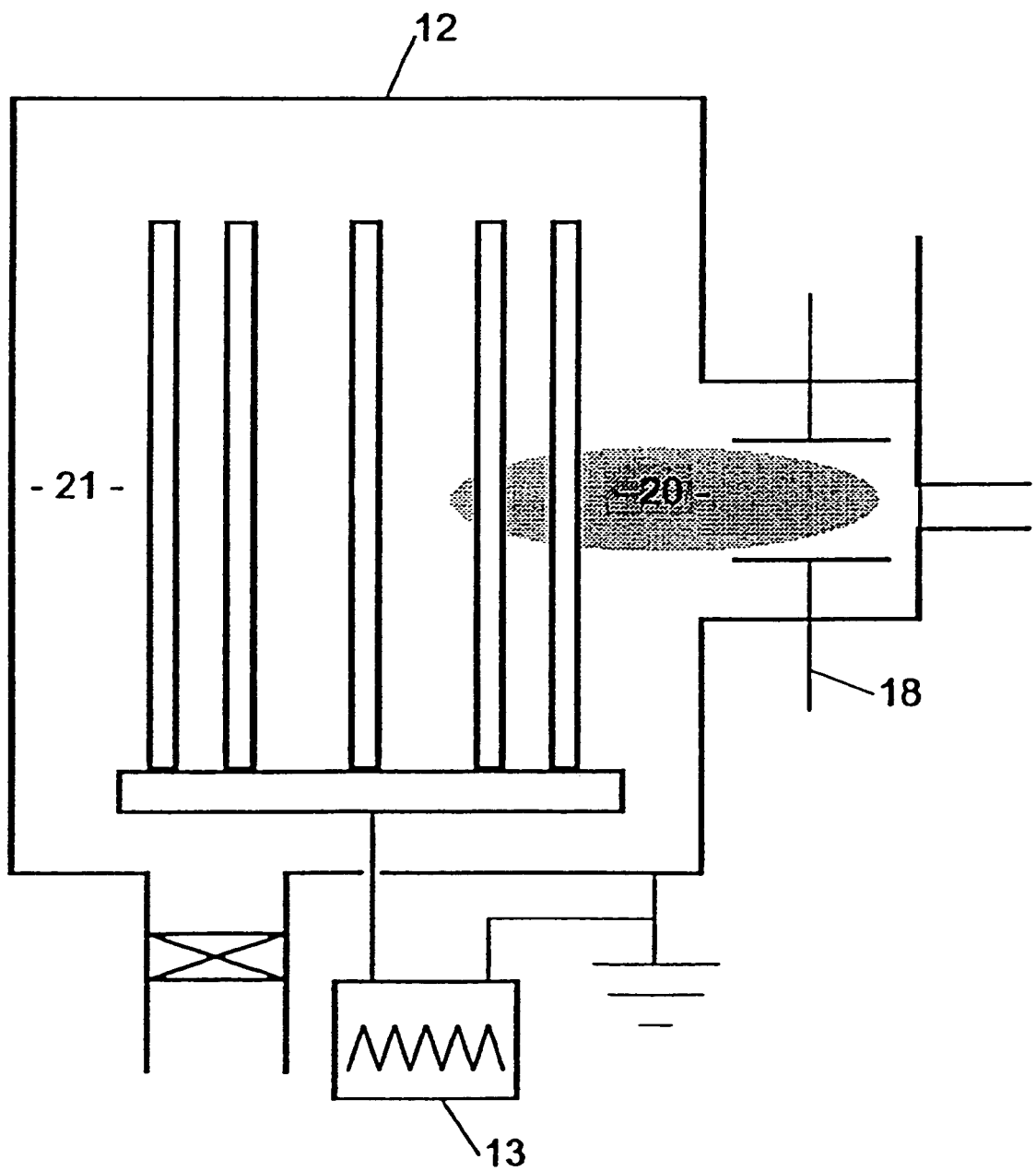
FIG. 4 shows a third embodiment of a device for plasma-CVD coating of substrates according to the present invention.

Instead of acetylene, which has the advantage that higher deposition rates can often be achieved therewith than with other reactive gases containing hydrocarbons. Other reactive gases containing carbon can also be used in the exemplary embodiments named above. For this purpose, the process parameters are to be adapted to the modified conditions. FIG. 4 shows a modified arrangement for the execution of the method according to the present invention. It differs from the arrangement shown in FIGS. 1 and 2 with respect to the means for the production of coating plasma 20. As a plasma source, a hollow cathode 18 is now used, which is arranged laterally on recipient 12 and is shaped as a hollow cylinder. The gas is brought into recipient interior 21 through cylindrical hollow cathode 18. The advantage of the arrangement is the high degree of excitation, and therewith the high effectiveness of the plasma production. In a modified embodiment, hollow cathode 18 is made up of two plates parallel to one another, whose length is matched to the size of recipient 12. With the use of acetylene as the reactive gas, using such an arrangement it is possible to deposit diamond-type carbon layers at rates considerably higher than 5 µm/h on moving substrates 10 in charge quantities that are industrially standard. Given an increase in gas pressure, in order to avoid particle formation it can make sense to use $CH_4$ or mixtures of different reactive gases containing hydrocarbons. The adjustment of the layer properties in turn takes place via variation of the substrate voltage using voltage supply 13. Given the installation of metal atoms that are removed from hollow cathode 18, the layer produced on the substrates is electrically conductive, dependent on the process parameters and the concentration of the installed metal atoms. In this case, instead of an alternating voltage a direct voltage can be applied to substrate 10. For the reduction of the coating temperature and better control of the layer properties, the use of a pulsed bias voltage source is also recommended.

Figure 5:
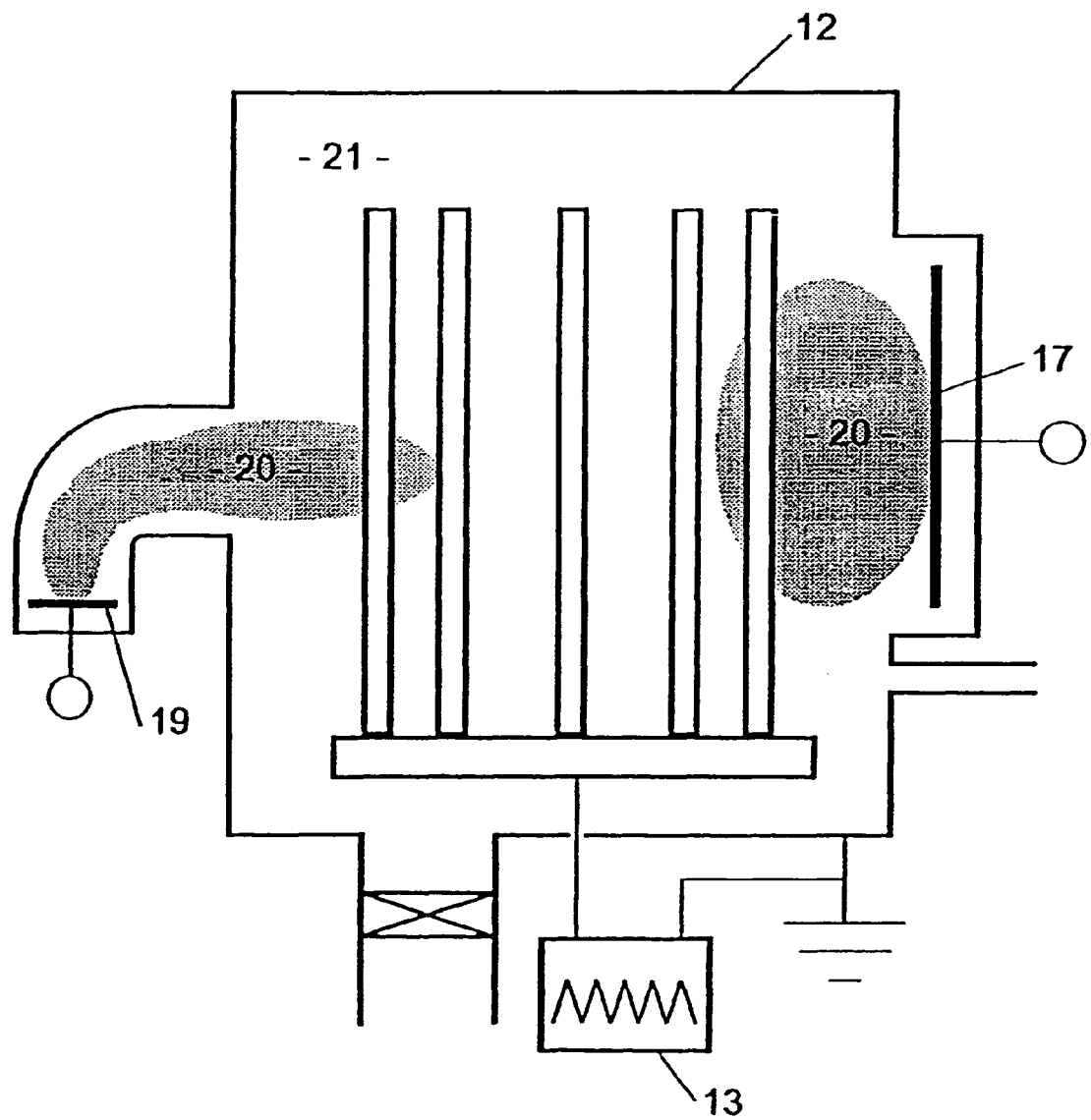
FIG. 5 shows a fourth embodiment of a device for plasma-CVD coating of substrates according to the present invention.

A further modified arrangement, suited in particular for the depositing of carbon layers, is shown in FIG. 5. Again, it differs from the arrangement shown in FIGS. 1 and 2 with respect to the means for the production of plasma 20. Here the plasma production takes place using a high-current arc that is ignited between a carbon target 19 arranged in the side wall of recipient 12 and an anode (not shown), and using a sputter cathode 17 arranged in the opposite side wall. The advantage of the high-current arc is the high degree of ionization of the released carbon. Since no gases containing hydrogen are required for bringing in the carbon, the resulting layer deposited on substrates 10 is free of hydrogen and is, therefore, particularly resistant to temperature. Such hydrogen-free carbon layers have a hardness of up to 80 GPa. In the embodiment of the arrangement shown in FIG. 5, graphitic macroparticles that arise during the arc vaporization are likewise deposited on substrates 10. This effect can be desirable, since the macroparticles are for example suited as lubricant deposits built into the layer. On the other hand, pulsing of the arc current allows suppression of the macroparticle formation, and a simultaneous increase of the arc current reinforces the suppression. An almost complete suppression of macroparticles can be achieved by magnetically deflecting the ions produced by the arc vaporization onto substrate 10. The uncharged macroparticles impinge on a target and are held at a distance from the layer deposition.

Alternatively, the bearing device can be made in such a way that the substrates are not moved during the coating. This can be advantageous, for example, due to higher deposition rates or achievable layer properties. In addition, the substrates can also be moved in pulsed fashion, so that they are each located in stationary fashion in different spatial areas of the recipient at different times.

Figure 6:
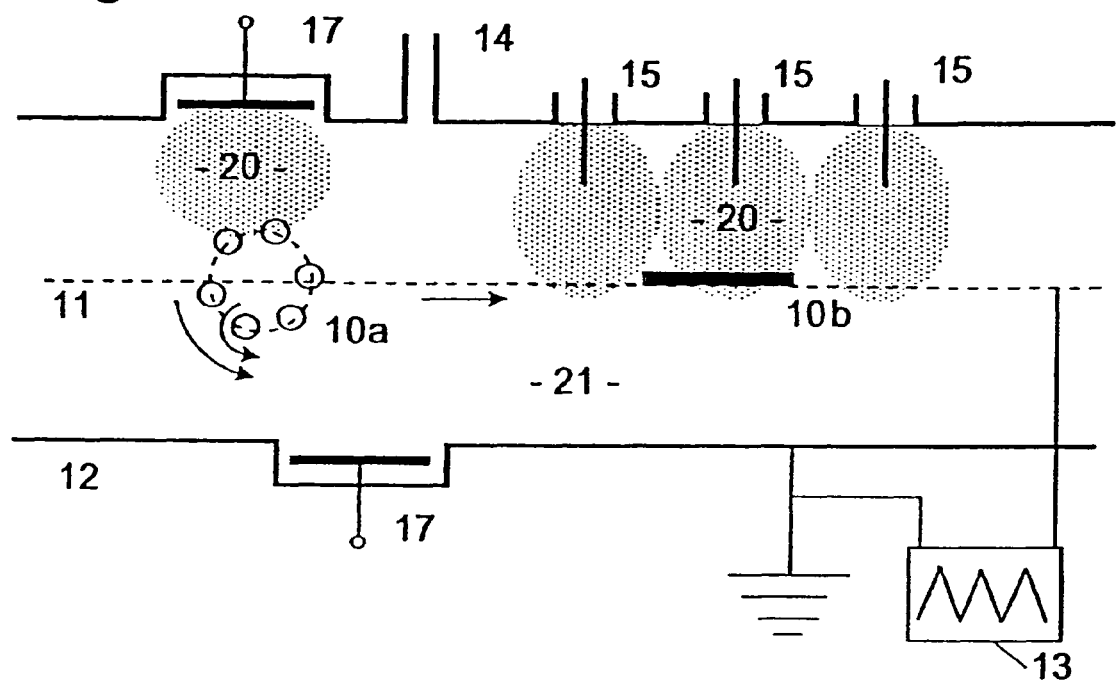
FIG. 6 shows a device constructed as a continuous-operation arrangement according to the present invention.

In a further application, the coating can also be carried out in a device that is a part of a larger network of devices. The substrates are thereby moved from device to device with or without interruption of the vacuum, one and or more processing steps is completed in each individual device. As an example, FIG. 6 shows a linear arrangement of devices in the form of a continuous-flow apparatus. The substrates 10a, 10b, which are mounted in rotating fashion or fixedly, are here by a suitable linear translator, indicated by an arrow, through the various devices—for example, as shown in FIG. 6, a magnetron sputter source 17 and three microwave sources 15, and in each device 17, 15 they undergo corresponding treatment or coating steps. Thus, for example there can take place sequentially: plasma etching, adhesive layer deposition, and main layer deposition. In this context, the substrates can be treated while moved, unmoved, or moved in pulsed fashion. Dependent on the substrate, the device, and the process, a treatment of lying or standing substrates can take place. Thus, for the treatment of films or glass a lying arrangement of the substrates is possible.

Figure 7:
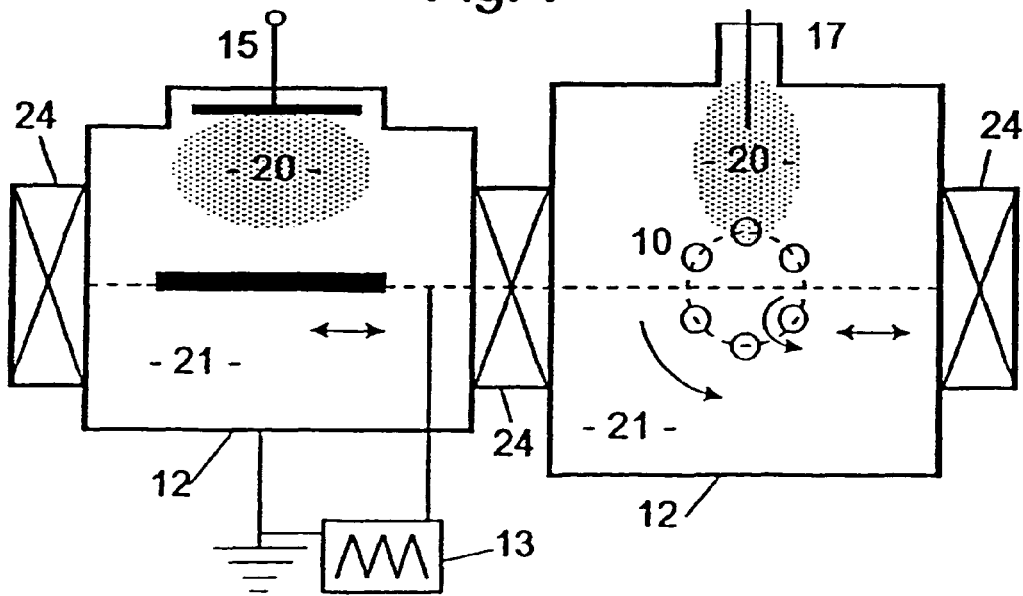
FIG. 7 shows a multichamber device according to the present invention.

As a further example of a network of devices, FIG. 7 shows a multi-chamber arrangement that has two recipients 12 connected via vacuum-sealed locks 24, between which substrates 10 to be coated can be transported back and forth. In the example in FIG. 7, a microwave source 15 is located in one recipient, and a magnetron sputter source 17 is located in the other.

In addition, for the plasma coating of bulk material the substrate holder can also be fashioned as a rotating basket that moves slowly about a plasma source.

The device according to the present invention can be advantageously used for the manufacture of a multilayer structure made up of alternating individual layers. In comparison with individual layers of the same thickness, multilayer structures that have a lower internal stress can be deposited. This reduces the tendency to lose adhesion in the layers.

Due to its outstanding effect as corrosion and wear protection for tribologically highly loaded components, constructions of the above-cited multilayer structures made up of alternating individual layers of hard material and carbon are particularly advantageous. Corresponding to the provided application, with regard to the composition it is preferable in this context to combine one type of hard material layer and one type of carbon layer. Each type is selected from a large number of representatives of the two layer types.

In the manufacture of the layers of the named multilayer structure, in principle the procedure is the same as in the manufacture of individual layers. However, a difference in the method results due to the fact that successively alternating layers must be applied. The specimens are pre-cleaned and brought into a recipient as shown in simplified fashion in FIG. 3. This recipient is evacuated to a pressure of less than approximately $1 \times 10^{-4}$ mbar. Subsequently, the specimens are fine-cleaned in the plasma, for example through plasma glowing. The layers are then applied. In order to produce alternating layers, the specimens are, for example, moved using planetary drives, and in this way are moved past different sources cyclically. Through the movement of the specimens relative to the sources, the deposition of homogenous layers even on complexly shaped specimens is facilitated. The devices illustrated on the basis of FIGS. 1 to 7 can be used for the execution of the method according to the present invention. Here the sources can be arranged arbitrarily, for example (as the sputter cathode in FIG. 3) on the recipient wall or in the interior of the recipient. If necessary, the devices shown in FIGS. 3 and 5 (for example) can be further modified, e.g. by installing an additional sputter cathode (see below).

During the movement past a first source, a first layer is deposited on the specimen. The layer thickness depends on the coating rate of the source and the speed of the specimen. The specimen is then led past a second source, and here a second layer is applied. The specimen is again led past the first source and is coated, etc. Through this movement relative to different sources and the cyclical coating thereby carried out, and given a suitable selection of the coating rate and the speed of the probe, the desired multilayer structure is deposited.

The operating parameters are dependent on the sources used. Sputter cathodes are operated in particular in a pressure range of $1-3 \times 10^{-3}$ mbar, set through the letting in of Ar or another noble gas. The hard material layers are preferably produced by sputtering of sputter targets that have the composition of the desired layer, or by reactive sputtering. As an alternative to sputtering, vaporization can be applied in the arc during the depositing. As carbon dispensers for the hard material layer and the carbon layers, gases containing carbon such as acetylene or methane can be used, but graphite targets, targets made of metal carbide and arcs can also be used; as nitrogen dispensers, gases containing nitrogen such as nitrogen and ammonia, and targets made of metal nitride, can be used, and silanes and siloxanes and targets made of metal silicide can be used as silicon dispensers. The power with which the cathodes are operated is preferably between 2 kW and 20 kW per cathode. The coating rate can be set by controlling the power, which is important because the sources are made up of different materials, and a multilayer structure is sought in which the individual layers have approximately equal layer thicknesses.

Alternatively, the multilayer structure can also be constructed from alternating hard material and silicon individual layers. The structure in which the silicon layer can have the compositions stated above has the advantages also stated above. In manufacturing, the same methods and devices can be used (adapted correspondingly with respect to the targets and the reactive gases), as in the structures made of alternating hard material and carbon individual layers.

In the following, seven exemplary embodiments of the inventive multilayer structure are described that are constructed from alternating hard material and carbon layers. The two layer types are each formed from one material.

EXAMPLE 1

The multilayer structure is made up of metal carbide (MeC) and carbon containing metal (C—(MeC)). Advantageous metals include, among others, tungsten (W), chromium (Cr) and titanium (Ti). The thicknesses of the individual layers are between approximately 3 nm and approximately 5 µm, and the overall layer thickness is between approximately 2 nm and 3 µm. The multilayer system is applied on a steel or hard metal substrate, such as a component or a tool.

The manufacture of the structure takes place by means of reactive sputtering of targets made of metals (Me) and of metal carbides (MeC) in an atmosphere made up of a mixture of noble gas, such as argon, a sputter gas, and a gas containing carbon, such as acetylene and methane, as a reactive gas. The layers can be deposited using a device that differs from that shown in FIG. 3 by an additional sputter cathode. In a conventional manner, the gas flow is set constant in such a way that sputtering takes place in one method step from the metal target MeC and in the next step from the MeC target C—(MeC), and in the subsequent step again from the metal target MeC, etc., until the required overall layer thickness is achieved.

EXAMPLE 2

The multilayer system is made of C-(MeC) as a hard material, the metal preferably is tungsten, and of metal-free amorphous carbon containing hydrogen (a-C:H). The layer thicknesses are in the same ranges as in the first exemplary embodiment. The C—(MeC) layer is produced by reactive sputtering of (for example) a WC target. The additional carbon is supplied by acetylene or methane. The a-C:H layer is obtained using one of the plasma sources described above, such as an RF source, an MW source (see FIG. 3) or a hollow cathode source (see FIG. 4) in the atmosphere containing acetylene or methane. The deposition of the multilayer structure can be carried out using the device shown in FIG. 3, or using a device that differs from that shown in FIG. 4 by an additional sputter cathode.

EXAMPLE 3

The multilayer system is made of a metal (Me) as a hard material and a-C:H. The metal preferably is selected from those named in Example 1. The layer thicknesses are in the same ranges as in the first exemplary embodiment. For the application of the layers, two gas chambers separated from one another are required, so that the metal can be applied by sputtering or vacuum metallization of metal in an atmosphere that does not contain carbon, and a-C:H can be deposited in an atmosphere containing methane or acetylene. The manufacture of the multilayer structure can be carried out using devices that operate similarly to those shown in FIGS. 6 and 7. A separation of the gas chambers also is possible (though not shown) in the device shown in FIG. 6. So that a large number of sources is not required for each layer, constructions of the devices are advantageous in which the specimens are led back to the beginning of the device after the application of the first two layers, and the application of two additional layers is then repeated, etc.

EXAMPLE 4

In the multilayer system, the alternating layers are made up of a metal carbide (MeC) as a hard material and a-C:H. The metals preferably are selected from those named in Example 1. The layer thicknesses are in the same ranges as in the first exemplary embodiment. The MeC layer is deposited by reactive sputtering of a target made of the Me in an atmosphere containing acetylene. The a-C:H layer is obtained using one of the above-described plasma sources, such as an RF source, an MW source (see FIG. 3), or a hollow cathode source (see FIG. 4) in the atmosphere containing acetylene. The deposition of the multilayer structure can be produced using the device shown in FIG. 3 or a device that differs from the one shown in FIG. 4 by an additional sputter cathode.

EXAMPLE 5

The multilayer system is made up of a metal nitride (MeN) as a hard material, the metals preferably being titanium or chromium, and of a-C:H. The layer thicknesses are in the same ranges as in the first exemplary embodiment. The deposition of the MeN layer is achieved either by sputtering of an MeN target or by reactive sputtering of an Me target. A gas containing nitrogen is used as a reactive gas, and the atmosphere is separated from the atmosphere containing carbon in which the a-C:H layer is deposited. As in Example 3, the manufacture of the multilayer structure can be carried out using devices that operate similarly to those in FIGS. 6 and 7. Due to the details, reference is made to Example 3.

EXAMPLE 6

The multilayer system is made up of a metal carbonitride (MeCN) as a hard material, the metals preferably are titanium or chromium, and of a-C:H. For the production of the MeCN layer, there are in particular two alternatives: reactive sputtering of an Me target, in which the reactive gas is a mixture of a gas containing nitrogen and a gas containing carbon, and reactive sputtering of an MeN target, in which a gas containing carbon is used as the reactive gas. For the deposition of the a-C:H layer, a gas containing carbon is used. The reactive gas used in the second alternative in the reactive sputtering can used at the same time as the deposition of the a-C:H layer, while in the first alternative the deposition of the a-C:H layer takes place in a gas chamber separate from the sputter atmosphere, this chamber containing a reactive gas that contains carbon but is free of nitrogen. As in Example 3, the deposition corresponding to the first alternative can be carried out using devices that operate in a manner similar to those shown in FIGS. 6 and 7; due to the details, reference is made here to Example 3. The deposition corresponding to the second alternative can be carried out using the device shown in FIG. 3.

EXAMPLE 7

In variants of the multilayer structures described in Examples 3, 4, 5 and 6, the carbon layer is made of a-C instead of a-C:H. The hard material layer preferably is sputtered from a target that is made of Me, MeC, MeN or MeCN, according to the desired composition of the hard material layer, and the a-C layer is sputtered from a graphite target or is produced using a carbon arc. According to the manner in which the a-C layer is produced, the multilayer structure can be deposited using the device shown in FIG. 5 or a device that differs from that shown in FIG. 5 in that a graphite target is provided instead of the carbon target 19.

Through corresponding selection of the manufacturing conditions, such as the sputter target and the reactive gases, the examples described above can be modified such that instead of the carbon layers, corresponding silicon layers are produced, and, if necessary, the carbon in the hard material layer is replaced by silicon. Thus, multilayer structures made for example of alternating Me and a-Si:H individual layers, or of alternating MeSi- and a-Si:H, can be produced, as described in Examples 3 and 4.

Other layer combinations also can be advantageously used, e.g. combinations in which the hard material layers, and likewise the carbon or silicon layers, are not all made of the same material, and/or in which a carbon layer is combined with a hard material layer containing silicon or silicon and carbon, or a silicon layer is combined with a hard material layer containing carbon or carbon and silicon.

What is claimed is:

1. A plasma CVD device for vacuum coating a substrate, comprising:
    a vacuum recipient;
    a bearing device for receiving the substrate to be coated;
    an arrangement for producing a plasma in an interior of the vacuum recipient and including one of a microwave source, a sputter cathode, a system for producing a high-current arc, and a hollow cathode; and
    a device, capable of being controlled separately from the arrangement for producing the plasma, for producing a substrate voltage that is applied to the substrate to be coated, wherein the device for producing the substrate voltage includes a direct voltage power supply unit that can be pulsed in bipolar fashion so that at least one of a length and a height of a positive pulse and a negative pulse of the substrate voltage can be adjusted independently of one another.

2. The plasma CVD device according to claim 1, wherein:
    the plasma CVD device is operated as a pass-through arrangement in which the substrate is moved on one of a uniform fashion and pulsed fashion.

3. The plasma CVD device according to claim 1, wherein;
    the arrangement for producing the plasma is operated in a pulsed fashion.

* * * * *